US012652762B2

(12) United States Patent
Togasaki et al.

(10) Patent No.: US 12,652,762 B2
(45) Date of Patent: Jun. 9, 2026

(54) METHOD FOR MANUFACTURING WIRING BOARD, AND WIRING BOARD

(71) Applicant: Resonac Corporation, Tokyo (JP)

(72) Inventors: Kei Togasaki, Tokyo (JP); Kazuyuki Mitsukura, Tokyo (JP); Masaya Toba, Tokyo (JP); Kenichi Iwashita, Tokyo (JP); Keishi Ono, Tokyo (JP); Mao Narita, Tokyo (JP)

( * ) Notice: Subject to any disclaimer, the term of this patent is extended or adjusted under 35 U.S.C. 154(b) by 169 days.

(21) Appl. No.: 18/294,158

(22) PCT Filed: Jul. 29, 2022

(86) PCT No.: PCT/JP2022/029358

§ 371 (c)(1),
(2) Date: Feb. 1, 2024

(87) PCT Pub. No.: WO2023/013556

PCT Pub. Date: Feb. 9, 2023

(65) Prior Publication Data

US 2024/0341039 A1 Oct. 10, 2024

(30) Foreign Application Priority Data

Aug. 2, 2021 (WO) .................. PCT/JP2021/028603

(51) Int. Cl.
*H05K 3/10* (2006.01)
*C25D 3/38* (2006.01)
(Continued)

(52) U.S. Cl.
CPC ................. *H05K 3/10* (2013.01); *C25D 3/38* (2013.01); *C25D 5/022* (2013.01); *C25D 5/605* (2020.08);
(Continued)

(58) Field of Classification Search
CPC ............. H05K 3/10; H05K 1/02; C25D 5/605
(Continued)

(56) References Cited

U.S. PATENT DOCUMENTS

2002/0068238 A1 * 6/2002 Hada ..................... G03F 7/0397 430/311
2009/0238956 A1 * 9/2009 Kojima .................. H05K 3/108 427/98.5
(Continued)

FOREIGN PATENT DOCUMENTS

JP 2004-006773 1/2004
JP 2004-327809 11/2004
(Continued)

OTHER PUBLICATIONS

International Search Report dated Oct. 26, 2021 for PCT/JP2021/028603.

(Continued)

*Primary Examiner* — Andargie M Aychillhum
(74) *Attorney, Agent, or Firm* — SHIPWAY IP

(57) ABSTRACT

A method for manufacturing a wiring board, including: forming a resist layer on a seed layer comprising a metal provided on a support body; forming a pattern including an opening to which the seed layer is exposed in the resist layer by light exposure and development of the resist layer; and forming a copper plating layer on the seed layer exposed into the opening by electrolytic plating, in this order. The arithmetic mean roughness Ra of the surface of the seed layer on a side opposite to the support body is 0.05 μm or more and 0.30 μm or less.

10 Claims, 3 Drawing Sheets

(51) Int. Cl.

| | |
|---|---|
| ***C25D 5/00*** | (2006.01) |
| ***C25D 5/02*** | (2006.01) |
| ***C25D 7/12*** | (2006.01) |
| ***H05K 1/02*** | (2006.01) |
| *H10W 70/05* | (2026.01) |
| *H10W 70/66* | (2026.01) |

(52) U.S. Cl.
CPC ............... *C25D 7/123* (2013.01); *H05K 1/02* (2013.01); *H05K 2203/11* (2013.01); *H10W 70/05* (2026.01); *H10W 70/66* (2026.01)

(58) Field of Classification Search
USPC .......................................................... 174/250
See application file for complete search history.

(56) References Cited

U.S. PATENT DOCUMENTS

2015/0282323 A1* 10/2015 Shimizu ............ H01L 23/49827
361/767
2018/0054891 A1* 2/2018 Ishihara ............ H01L 23/49827
2021/0199861 A1* 7/2021 Ma ......................... G02B 5/201

FOREIGN PATENT DOCUMENTS

| | | |
|---|---|---|
| JP | 2006-098982 | 4/2006 |
| JP | 2009-260216 | 11/2009 |
| JP | 2012-039021 | 2/2012 |
| JP | 2018-006476 | 1/2018 |
| KR | 20080057343 | 6/2008 |
| WO | 2020/196112 | 10/2020 |

OTHER PUBLICATIONS

International Search Report dated Oct. 25, 2022 for PCT/JP2022/029358.

International Preliminary Report on Patentability with Written Opinion dated Feb. 15, 2024 for PCT/JP2021/028603.

International Preliminary Report on Patentability with Written Opinion dated Feb. 15, 2024 for PCT/JP2022/029358.

* cited by examiner

METHOD FOR MANUFACTURING WIRING BOARD, AND WIRING BOARD

CROSS-REFERENCE TO RELATED APPLICATIONS

This application is a 35 U.S.C. § 371 national phase application of PCT/JP2022/029358, filed on Jul. 29, 2022, which claims priority to International Patent Application No. PCT/JP2021/028603, filed on Aug. 2, 2021.

TECHNICAL FIELD

The present disclosure relates to a method for manufacturing a wiring board, and a wiring board.

BACKGROUND ART

A wiring board configuring an electronic device is required to have wiring with a minute width to respond to a demand for a smaller, lighter, and faster electronic device. As a method for forming the wiring with a minute width, a semi-additive (SAP) method and a modified semi-additive (MSAP) method are widely used (Patent Literature 1). In general, such methods include a step of forming a copper plating layer on a seed layer by electrolytic plating. In general, the seed layer is formed by electroless plating in SAP, and formed by laminating a copper foil in MSAP.

CITATION LIST

Patent Literature

Patent Literature 1: Japanese Unexamined Patent Publication No. 2004-6773

SUMMARY OF INVENTION

Technical Problem

In the case of forming the copper plating layer on the seed layer by the electrolytic plating, a minute black portion with a width of less than 0.3 μm may be observed in the copper plating layer in the vicinity of the interface between the seed layer and the copper plating layer. Such a black portion is estimated to be a minute void. The void is extremely minute, thereby being less likely to affect the characteristics of the wiring itself, but there is a concern that adhesiveness between the copper plating layer and the seed layer can be insufficient when the number of minute voids increases as the width of the wiring further decreases.

An aspect of the present disclosure relates to a method for suppressing the occurrence of a minute black portion in the vicinity of an interface between a seed layer and a copper plating layer in the case of manufacturing a wiring board by a method including forming the copper plating layer on the seed layer by electrolytic plating.

Solution to Problem

An aspect of the present disclosure relates to the following.

[1] A method for manufacturing a wiring board, comprising:
forming a resist layer on a seed layer comprising a metal provided on a support body;

forming a pattern including an opening to which the seed layer is exposed in the resist layer by light exposure and development of the resist layer; and
forming a copper plating layer on the seed layer exposed into the opening by electrolytic plating, in this order,
in which arithmetic mean roughness Ra of a surface of the seed layer on a side opposite to the support body is 0.05 μm or more and 0.30 μm or less.

[2] The method according to [1], further comprising providing the seed layer on the support body by electroless plating.

[3] The method according to [2], further comprising roughening a surface of the support body,
in which the seed layer is provided on the roughened surface of the support body.

[4] The method according to [3], in which the surface of the support body is roughened such that surface roughness Ra of the surface of the support body is 0.05 μm or more and 0.30 μm or less.

[5] The method according to [1], further comprising providing the seed layer by laminating a metal foil on the support body.

[6] The method according to any one of [1] to [5], in which a thickness of the seed layer is 200 nm or more and 1000 nm or less.

[7] The method according to any one of [1] to [6], in which the resist layer before the light exposure contains a binder polymer containing a (meth)acrylic acid as a monomer unit.

[8] The method according to [7], in which the binder polymer further comprises at least one of (meth)acrylic acid benzyl ester or a derivative thereof, or styrene or a styrene derivative, as a monomer unit.

[9] The method according to any one of [1] to [8], in which the resist layer before the light exposure contains a dye.

[10] The method according to any one of [1] to [9], in which the arithmetic mean roughness Ra of the surface of the seed layer on a side opposite to the support body is adjusted in a range of 0.05 μm or more and 0.30 μm or less such that the number of black portions with a width of less than 0.3 μm observed in the copper plating layer in the vicinity of an interface between the seed layer and the copper plating layer, is 9.0 or less per a width of 1 μm in a direction parallel to a main surface of the support body.

[11] A wiring board, including:
a support body; and
wiring including a seed layer comprising a metal provided on the support body, and a copper plating layer formed by electrolytic plating,
in which arithmetic mean roughness Ra of a surface of the seed layer on a side opposite to the support body is 0.05 μm or more and 0.30 μm or less.

[12] The wiring board according to [11], in which the number of black portions with a width of less than 0.3 μm, which is observed in the copper plating layer in the vicinity of an interface between the seed layer and the copper plating layer, is 9.0 or less per a width of 1 μm in a direction parallel to a main surface of the support body.

Advantageous Effects of Invention

In the method according to an aspect of the present disclosure, in the case of manufacturing the wiring board by the method including forming the copper plating layer on the seed layer by the electrolytic plating, the occurrence of the minute black portion in the vicinity of the interface between the seed layer and the copper plating layer can be suppressed. In the wiring board according to an aspect of the present disclosure, adhesiveness between the copper plating layer and the seed layer can be excellent.

DESCRIPTION OF EMBODIMENTS

The present invention is not limited to the following examples. In this specification, "(meth)acryl" indicates both "methacryl" and "acryl". Other similar terms have the same meaning.

Figure 1:
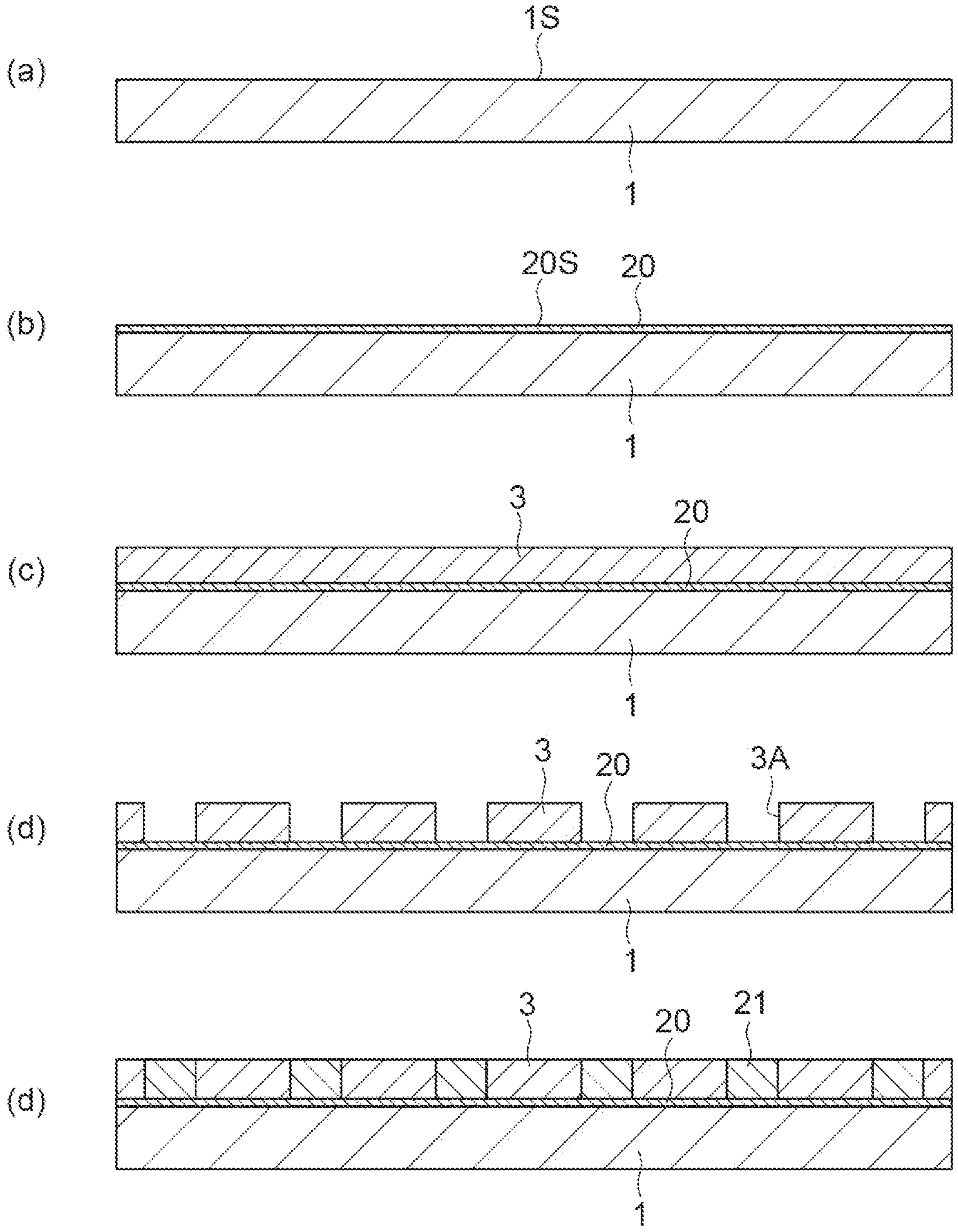
FIG. 1 is a flowchart illustrating an example of a method for manufacturing a wiring board.
Figure 2:
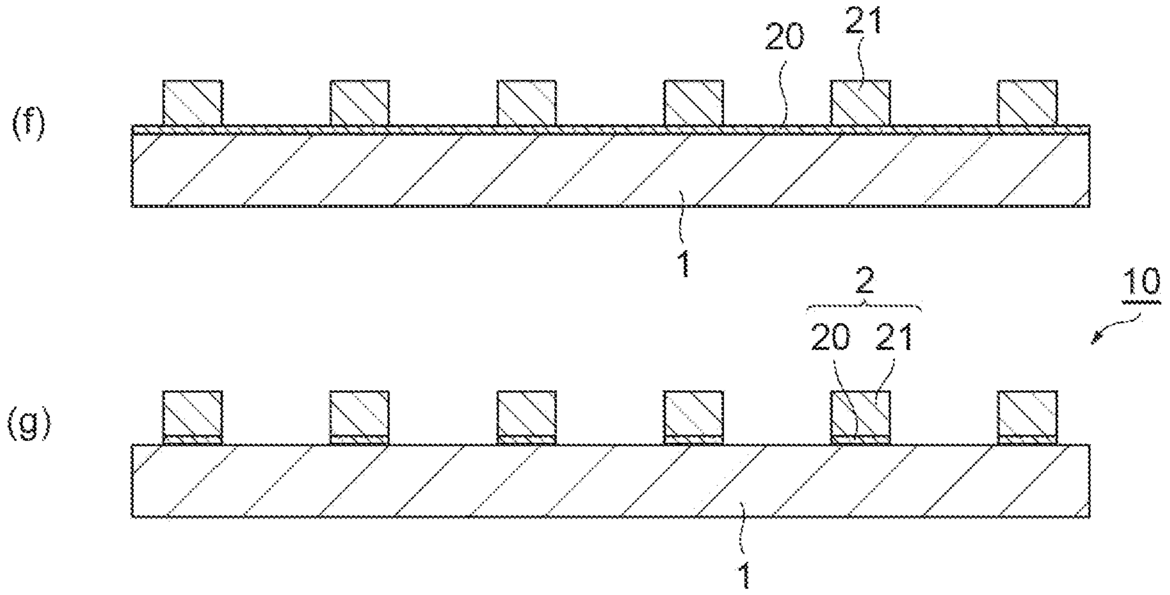
FIG. 2 is a flowchart illustrating an example of the method for manufacturing a wiring board.

FIG. 1 and FIG. 2 are flowcharts illustrating an example of a method for manufacturing a wiring board. The method illustrated in FIG. 1 includes a step of forming a seed layer 20 on one main surface 1S of a plate-shaped support body 1, a step of forming a resist layer 3 containing a resist material on a surface 20S of the seed layer 20 on a side opposite to the support body 1, a step of forming a pattern including an opening 3A to which the seed layer 20 is exposed in the resist layer 3 by the light exposure and the development of the resist layer 3, a step of forming a copper plating layer 21 on the seed layer 20 by electrolytic plating, a step of removing the resist layer 3 to expose a portion of the seed layer 20 that is not covered with the copper plating layer 21, and a step of removing the seed layer 20 in the exposed portion to form a wiring board 10 including a wiring 2 including the seed layer 20 and the copper plating layer 21, and the support body 1, in this order.

In general, the outermost layer of the support body 1 on a side where the seed layer 20 provided is mainly composed of an insulating layer. The insulating layer provided as the outermost layer of the support body 1, for example, may be an insulating resin layer such as a build-up layer. The support body 1 may include wiring connected to the wiring 2.

The seed layer 20 is a layer containing a metal, and is provided for the electrolytic plating. The seed layer 20, for example, can be a metal plating layer formed by electroless plating, a metal foil such as a copper foil, a metal layer formed by vapor deposition such as sputtering, or a metallic sintered layer. The metallic sintered layer is a layer formed by heating a coated film containing metal particles, and sintering the metal particles. The seed layer 20, for example, may contain at least one type of metal selected from the group consisting of copper, gold, silver, tungsten, molybdenum, tin, cobalt, chromium, iron, zinc, nickel, and titanium. The seed layer 20 may be a single layer, or may be composed of two or more layers. The thickness of the seed layer 20, for example, may be 100 nm or more, or 200 nm or more, and may be 2000 nm or less, 1000 nm or less, less than 1000 nm, 900 nm or less, 800 nm or less, 700 nm or less, 600 nm or less, or 500 nm or less.

The occurrence rate of a minute black portion in the copper plating layer 21 can be reduced on the basis of the roughness of the surface 20S of the seed layer 20 on a side opposite to the support body 1. Specifically, arithmetic mean roughness Ra of the surface 20S of the seed layer 20 on a side opposite to the support body 1 may be 0.05 μm or more and 0.30 μm or less. In a case where the arithmetic mean roughness Ra of the surface 20S is in such a range, it is easy to obtain an effect particularly excellent from the viewpoint of reducing the black portion in the copper plating layer 21. The reason that such effect is obtained is not necessarily obvious, but it is assumed that this is because in a case where the seed layer 20 has a surface that is rough to some extent, the occurrence of the black portion due to a minimum amount of resist material remaining on the surface of the seed layer 20 exposed into the opening 3A is reduced. Ra, for example, may be 0.06 μm or more, 0.07 μm or more, 0.08 μm or more, 0.09 μm or more, 0.10 μm or more, 0.11 μm or more, 0.12 μm or more, or 0.14 μm or more. In a case where Ra is large, there is a tendency that adhesiveness between the seed layer 20 and the resist layer 3 is improved. In a case where the adhesiveness is insufficient, a phenomenon such as the collapse of the resist layer 3 may occur. From the viewpoint of reducing the black portion in the copper plating layer 21, Ra may be 0.29 μm or less, 0.28 μm or less, 0.27 μm or less, 0.26 μm or less, 0.25 μm or less, 0.24 μm or less, 0.23 μm or less, 0.22 μm or less, 0.21 μm or less, or 0.20 μm or less. The arithmetic mean roughness Ra of the surface of the seed layer 20 on a side opposite to the support body 1 may be adjusted in the range exemplified above such that the number of black portions with a width of less than 0.3 μm, which is observed in the copper plating layer in the vicinity of the interface between the seed layer 20 and the copper plating layer 21, is 9.0 or less per a width of 1 μm in a direction parallel to the main surface of the support body 1.

The arithmetic mean roughness of the surface 20S of the seed layer 20, for example, can be adjusted by a method for forming a seed layer, the control of the surface roughness of the main surface 1S of the support body 1 positioned below the seed layer, a surface treatment (for example, an etching treatment) of the surface 20S of the seed layer 20, or a combination thereof. In a case where the seed layer 20 is the metal foil, for example, the arithmetic mean roughness Ra of the surface 20S can be controlled on the basis of the surface roughness of the metal foil. In a case where the seed layer 20 is the metal plating layer formed by the electroless plating, for example, the arithmetic mean roughness Ra of the surface 20S can be controlled on the basis of the surface roughness of the main surface 1S of the support body 1. In general, in a case where the surface roughness of the main surface 1S of the support body 1 is large, there is a tendency that the arithmetic mean roughness Ra of the surface 20S of the seed layer 20 increases. The surface roughness Ra of the main surface 1S of the support body 1 (for example, the surface of the insulating resin layer) may have the same surface roughness Ra as the surface roughness Ra of the surface 20S of the seed layer 20.

The main surface 1S of the support body 1 can be the surface of the insulating layer. The main surface 1S of the support body 1 (the insulating layer), for example, can be a surface roughened by wet desmear, dry desmear, or a combination thereof. The wet desmear may be a chemical treatment including contact with a chemical. The dry desmear, for example, may be at least one type selected from ultraviolet irradiation, an oxygen plasma treatment, and an argon plasma treatment.

The surface roughening by the chemical treatment may include immersing the insulating layer (the support body 1) into the chemical for the desmear of the insulating layer. The chemical used for the surface roughening, for example, is selected from a sodium permanganate solution, a sodium hydroxide solution, a potassium permaganate solution, a chromium solution, and a sulfuric acid. The surface roughening by the chemical treatment, for example, includes swelling the insulating layer by immersion into boiling water or a predetermined swelling liquid, immersing the insulating layer in a sodium permanganate solution, washing the insulating layer with water, and drying the insulating layer. The degree of surface roughening can be adjusted in accordance with the concentration and the temperature of each chemical, an immersion time into the chemical, ultrasonic irradiation, or a combination thereof.

The resist layer 3 can be formed of a photosensitive resist material generally used to form wiring. The thickness of the resist layer 3, for example, may be 5 μm or more and 120 μm or less, 5 μm or more and 50 μm or less, 10 μm or more and 120 μm or less, or 10 μm or less and 50 μm or less.

The resist layer 3 is formed by forming a film of the resist material. The resist layer 3 may be provided by laminating a resist film formed in advance using the resist material.

The resist material (or the resist layer 3 before light exposure), for example, may be a photosensitive resin composition containing a binder polymer, a photopolymerizable compound having an ethylenically unsaturated bond, and a photopolymerization initiator.

The binder polymer, for example, may contain a (meth) acrylic acid as a monomer unit. A ratio of the monomer unit derived from the (meth)acrylic acid in the binder polymer may be 5 to 30% by mass, 5 to 25% by mass, or 10 to 25% by mass, on the basis of the mass of the binder polymer.

The binder polymer may be a copolymer containing a (meth)acrylic acid and (meth)acrylic acid benzyl ester or a derivative thereof as a monomer unit, a copolymer containing a (meth)acrylic acid and styrene or a styrene derivative as a monomer unit, or a copolymer containing a (meth) acrylic acid and (meth)acrylic acid benzyl ester or a derivative thereof and styrene or a styrene derivative as a monomer unit. The binder polymer containing such a monomer unit may further contain (meth)acrylic acid alkyl ester as a monomer unit.

Specific examples of the (meth)acrylic acid benzyl ester derivative configuring the binder polymer include 4-methyl benzyl (meth)acrylate, 4-ethyl benzyl (meth)acrylate, 4-tert-butyl benzyl (meth)acrylate, 4-methoxybenzyl (meth)acrylate, 4-ethoxybenzyl (meth)acrylate, 4-hydroxyl benzyl (meth)acrylate, and 4-chlorobenzyl (meth)acrylate. The binder polymer may contain two or more types of (meth) acrylic acid benzyl esters as a monomer unit, or may contain both of the (meth)acrylic acid benzyl ester and the derivative thereof as a monomer unit.

A ratio of the monomer unit derived from the (meth) acrylic acid benzyl ester or the derivative thereof in the binder polymer may be 50 to 80% by mass, 50 to 75% by mass, 50 to 70% by mass, or 50 to 65% by mass, on the basis of the mass of the binder polymer.

Specific examples of the styrene derivative configuring the binder polymer include vinyl toluene, p-methyl styrene, p-chlorostyrene, α-methyl styrene, p-hydroxystyrene, p-methoxystyrene, p-carboxystyrene, and p-(2-chloroethyl) styrene. The binder polymer may contain two or more types of styrene derivatives as a monomer unit, or may contain both of the styrene and the derivative thereof as a monomer unit.

A ratio of the monomer unit derived from the styrene or the styrene derivative in the binder polymer may be 5 to 40% by mass, or 5 to 35% by mass, on the basis of the mass of the binder polymer.

The (meth)acrylic acid alkyl ester configuring the binder polymer may be an ester compound formed of a (meth) acrylic acid and linear or branched aliphatic alcohol having 1 to 12 carbon atoms. The number of carbon atoms of the aliphatic alcohol may be 1 to 8, or 1 to 4. Specific examples of the (meth)acrylic acid alkyl ester include methyl (meth) acrylate, ethyl (meth)acrylate, propyl (meth)acrylate, isopropyl (meth)acrylate, butyl (meth)acrylate, tert-butyl (meth)acrylate, pentyl (meth)acrylate, hexyl (meth)acrylate, heptyl (meth)acrylate, octyl (meth)acrylate, and 2-ethyl hexyl (meth)acrylate. The binder polymer may contain two or more types of (meth)acrylic acid alkyl esters as a monomer unit.

A ratio of the monomer unit derived from the (meth) acrylic acid alkyl ester in the binder polymer may be 1 to 20% by mass, 1 to 15% by mass, 1 to 10% by mass, or 1 to 5% by mass, on the basis of the mass of the binder polymer.

The weight average molecular weight (Mw) of the binder polymer may be 20000 to 150000, 30000 to 100000, 40000 to 80000, or 40000 to 60000. Here, the weight average molecular weight indicates a value in terms of standard polystyrene obtained by gel permeation chromatography (GPC).

The acid value (mgKOH/g) of the binder polymer may be 13 to 78, 39 to 65, or 52 to 62. Here, the acid value indicates the amount (mg) of potassium hydroxide required for the neutralization of 1 g of the binder polymer.

The content of the binder polymer in the resist material (or the resist layer 3 before light exposure) may be 40 to 80 parts by mass, 45 to 75 parts by mass, or 50 to 70 parts by mass, with respect to 100 parts by mass of the total amount of the binder polymer and the photopolymerizable compound.

Specific examples of the photopolymerizable compound having an ethylenically unsaturated bond include a bisphenol A-based (meth)acrylate compound, a hydrogenated bisphenol A-based (meth)acrylate compound, polyalkylene glycol (meth)acrylate, a urethane monomer, pentaerythritol (meth)acrylate, and trimethylol propane (meth)acrylate. Only one type of photopolymerizable compound is used alone, or two or more types thereof are used in combination. The bisphenol A-based di(meth)acrylate compound, for example, may be a compound represented by General Formula (1) described below.

(1)

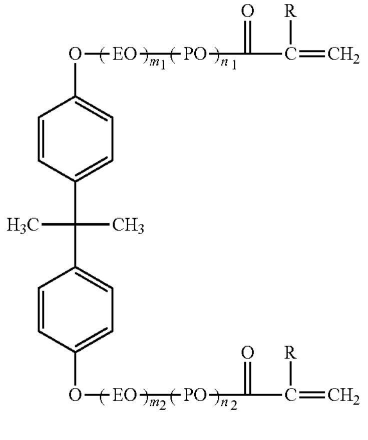

In Formula (1), two Rs each independently represent a hydrogen atom or a methyl group. Each of EO and PO represents an oxyethylene group and an oxypropylene group. $m_1$, $m_2$, $n_1$, and $n_2$ each independently represent 0 to 40, $m_1+m_2$ is 1 to 40, and $n_1+n_2$ is 0 to 20. Either EO or PO may be on a phenolic hydroxyl group side. $m_1$, $m_2$, $n_1$, and $n_2$ each represent the number of Eos or POs. A compound in which $m_1+m_2$ is 5 or less on average and a compound in which $m_1+m_2$ is 6 to 40 on average may be combined.

The polyalkylene glycol (meth)acrylate may be a compound represented by Formula (2) described below. As the photopolymerizable compound having an ethylenically unsaturated bond, the bisphenol A-based di(meth)acrylate compound and the compound represented by Formula (2) described below may be combined.

(2)

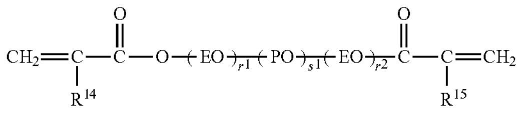

In Formula (2), $R^{14}$ and $R^{15}$ each independently represent a hydrogen atom or a methyl group, EO and PO have the same meaning as described above, $s^1$ represents 1 to 30, $r^1$ and $r^2$ each represent 0 to 30, and $r^1+r^2$ is 1 to 30. Examples of a commercially available product of the compound represented by Formula (2) include a vinyl compound (manufactured by Showa Denko Materials Co., Ltd., Product Name: FA-023M) in which $R^{14}$ and $R^{15}$ are a methyl group, $r^1+r^2=4$ (the average value), and $s^1=12$ (the average value).

Specific examples of the photopolymerization initiator include aromatic ketone such as benzophenone, N,N'-tetramethyl-4,4'-diaminobenzophenone (Michler's ketone), N,N'-tetraethyl-4,4'-diaminobenzophenone, 4-methoxy-4'-dimethyl aminobenzophenone, 2-benzyl-2-dimethyl amino-1-(4-morpholinophenyl)-butanone-1, and 2-methyl-1-[4-(methyl thio)phenyl]-2-morpholino-propanone-1; quinones such as 2-ethyl anthraquinone, phenanthrene quinone, 2-tert-butyl anthraquinone, octamethyl anthraquinone, 1,2-benzanthraquinone, 2,3-benzanthraquinone, 2-phenyl anthraquinone, 2,3-diphenyl anthraquinone, 1-chloroanthraquinone, 2-methyl anthraquinone, 1,4-naphthoquinone, 9,10-phenanthraquinone, 2-methyl 1,4-naphthoquinone, and 2,3-dimethyl anthraquinone; a benzoin ether compound such as benzoin methyl ether, benzoin ethyl ether, and benzoin phenyl ether, and a benzoin compound such as benzoin, methyl benzoin, and ethyl benzoin; a benzyl derivative such as benzyl dimethyl ketal, and a 2,4,5-triaryl imidazole dimer such as a 2-(o-chlorophenyl)-4,5-diphenyl imidazole dimer, a 2-(o-chlorophenyl)-4,5-di(methoxyphenyl) imidazole dimer, a 2-(o-fluorophenyl)-4,5-diphenyl imidazole dimer, a 2-(o-methoxyphenyl)-4,5-diphenyl imidazole dimer, and a 2-(p-methoxyphenyl)-4,5-diphenyl imidazole dimer; an acridine derivative such as 9-phenyl acridine and 1,7-bis(9,9'-acridinyl) heptane, N-phenyl glycine, a N-phenyl glycine derivative, and a coumarin-based compound. Only one type of photopolymerization initiator is used alone, or two or more types thereof are used in combination. The photopolymerization initiator may include the 2,4,5-triaryl imidazole dimer, in particular, the 2-(o-chlorophenyl)-4,5-diphenyl imidazole dimer.

The content of the photopolymerization initiator in the resist material (or the resist layer 3 before light exposure) may be 0.01 to 5 parts by mass, 0.1 to 4.5 parts by mass, or 1 to 4 parts by mass, with respect to 100 parts by mass of the total amount of the binder polymer and the photopolymerizable compound.

The resist material (or the resist layer 3 before light exposure) may contain a dye. The dye, for example, may be at least one type selected from the group consisting of a leuco dye, phthalocyanine green, crystal violet, methyl orange, Nile blue 2B, Victoria blue, malachite green, Basic blue 20, and Diamond green. The leuco dye, for example, may be leuco crystal violet, a fluoran dye, or a combination thereof.

The content of the dye may be 0.01 to 20 parts by mass with respect to 100 parts by mass of the total amount of the binder polymer and the photopolymerizable compound.

The resist material (or the resist layer 3 before light exposure), as necessary, may contain other components. Examples of the other components include a photopolymerizable compound having a cationically polymerizable cyclic ether group, a cationic polymerization initiator, a sensitizer, a thermal color development inhibitor, a plasticizer (such as p-toluene sulfonamide), a pigment, a filler, a defoamer, a flame retardant, a stabilizer, a tacktifier, a leveling agent, a peeling accelerator, an antioxidant, a fragrance, an imaging agent, and a thermal cross-linking agent. The content of each of the other components may be approximately 0.01 to 20 parts by mass with respect to 100 parts by mass of the total amount of the binder polymer and the photopolymerizable compound.

The total content of the binder polymer, the photopolymerizable compound, and the photopolymerization initiator in the resist material (or the resist layer 3 before light exposure) may be 90 to 100% by mass, or 95 to 100% by mass, with respect to the total mass of the components other than a solvent in the resist material (the resist layer 3).

In order to form the resist layer 3, the resist film containing the resist material may be laminated on the seed layer 20, or the resist material containing a solvent may be applied to the seed layer 20, and the solvent may be removed from the coated film.

A part of the resist layer 3 is exposed with light, and the resist layer 3 after light exposure is developed to form the resist layer 3 having the pattern including the opening 3A. The light exposure and the development can be performed by a general method known to a person skilled in the art. By the light exposure via a photomask, a fine pattern including the opening 3A to which the seed layer 20 is exposed is formed. A developer for development may be an alkaline aqueous solution such as an aqueous solution of sodium carbonate.

Subsequently, before the electrolytic plating, the surface 20S of the seed layer 20 exposed into the opening 3A may be pretreated by being in contact with a pretreatment liquid at a predetermined pretreatment temperature. The surface of the seed layer 20 can be pretreated by immersing an intermediate structure including the support body 1, the seed layer 20, and the resist layer 3 having the pattern in the pretreatment liquid adjusted to the predetermined pretreatment temperature. The pretreatment temperature may be suitably set in accordance with the type of pretreatment liquid, or the like, and for example, may be in a range of 20 to 50° C. An immersion time into the pretreatment liquid, for example, may be 1 to 8 minutes.

The pretreatment liquid, for example, may be an acidic aqueous solution containing an acid component, an additive for electrolytic plating, and a reductant.

The acid component may be an organic acid, an inorganic acid, or a combination thereof, and specific examples thereof include a sulfuric acid; an alkane sulfonic acid such as a methane sulfonic acid and a propane sulfonic acid; an alkanol sulfonic acid such as an isethionic acid and a propanol sulfonic acid; and a carboxylic acid such as a citric acid, a tartaric acid, and a formic acid. Only one type of acid component can be used alone, or two or more types thereof can be used in combination. The concentration of the acid component in the pretreatment liquid may be 10 to 300 g/L, or 50 to 200 g/L, on the basis of the volume of the pretreatment liquid.

The additive for electrolytic plating, for example, may be a polyether compound, an organic sulfur compound, or a combination thereof. Examples of the polyether compound include polyethylene glycol, polypropylene glycol, and a derivative thereof. The organic sulfur compound is a copper plating precipitation accelerator, which may be referred to as a brightener, and examples thereof include a 3-mercapto-propane sulfonic acid and a bis(3-sulfopropyl) disulfide disodium salt. The concentration of the additive in the pretreatment liquid may be 0.1 to 10000 mg/L, on the basis of the volume of the pretreatment liquid.

Examples of the reductant include a hypophosphite, a phosphite, dimethyl amine borane, trimethyl amine borane, a hydrazine derivative, a borohydride salt, an aldehyde compound (for example, formalin and a glyoxylic acid), titanium (III) chloride, catechol, resorcin, hydroquinone, an ascorbate, phenylene diamine, and a phosphinic acid derivative. Only one type of reductant is used alone, or two or more types thereof are used in combination. The concentration of the reductant in the pretreatment liquid may be 0.0001 to 0.1 mol/L, on the basis of the volume of the pretreatment liquid.

The pretreatment liquid may further contain a surfactant selected from an alkyl benzene sulfonate, a compound having an acetylene group, and the like. The pretreatment liquid may contain a carboxylic acid or an alkane sulfonic acid, an inorganic acid selected from a hydrochloric acid, a sulfuric acid, a phosphoric acid, and a nitric acid, an alkyl benzene sulfonate, and a compound having an acetylene group. In this case, the content of the carboxylic acid and the alkane sulfonic acid may be 5 to 50 g/L, or 10 to 20 g/L, on the basis of the volume of the pretreatment liquid, and the content of the inorganic acid may be 1 to 20 g/L, or 2 to 10 g/L, on the basis of the volume of the pretreatment liquid.

The alkyl benzene sulfonate is a salt of a sulfonic acid compound having a benzene ring, and an alkyl group and a sulfonic acid group bonded to the benzene ring. The number of carbon atoms of the alkyl group may be 10 to 16. The alkyl benzene sulfonate may be a sodium salt, a potassium salt, or a triethanol amine salt. Specific examples of the alkyl benzene sulfonate include sodium linear dodecyl benzene sulfonate. The content of the alkyl benzene sulfonate may be 0.5 to 20 g/L, on the basis of the volume of the pretreatment liquid.

Examples of a commercially available product of the surfactant that is the compound having an acetylene group include SURFYNOL 104, SURFYNOL 440, and SURFYNOL 465 (Product Name, manufactured by Nissin Chemical Industry Co., Ltd.). The content of the compound having an acetylene group may be 0.1 to 5 g/L, or 0.3 to 1 g/L, on the basis of the volume of the pretreatment liquid.

The pretreatment liquid may contain a dispersant. The dispersant may be a polymer containing a monomer unit derived from a maleic acid, and examples of a commercially available product thereof include MALIALIM AKM-0531 (Product Name, manufactured by NOF CORPORATION). The content of the dispersant may be 0.1 to 5 g/L, or 0.3 to 1 g/L, on the basis of the volume of the pretreatment liquid.

The copper plating layer 21 for filling the opening 3A is formed on the pretreated surface of the seed layer 20 by the electrolytic plating. After that, the resist layer 3 is peeled off from the seed layer 20. The seed layer 20 in a portion exposed by peeling off the resist layer 3 is removed by a general method such as etching. As a result thereof, the wiring 2 composed of the seed layer 20 remaining on the support body 1, and the metal plating layer 21 is formed.

The electrolytic plating layer 21 and the wiring 2 may include a linear portion, and the width thereof, for example, may be 2 μm or more and 20 μm or less, or 5 μm or more and 20 μm or less. In other words, the line/space (L/S) of the wiring 2 may be 2 μm/2 μm to 20 μm/20 μm, or 5 μm/5 μm to 20 μm/20 μm. In the method according to the present disclosure, a defect such as the peeling or the collapse of the wiring may be less likely to occur even in the case of fine wiring.

The wiring board 10 manufactured by the steps described above includes the support body 1, and the wiring 2 including the seed layer 20 provided on the support body 1, and the copper plating layer 21 formed on the seed layer 20. The number of black portions observed in the copper plating layer 21 may be 9.0 or less, or 8.0 or less per a width of 1 μm in the direction parallel to the main surface of the support body 1, and the number of black portions herein indicates the number of black portions with the maximum width of less than 0.3 μm, which is observed by a scanning electron microscope. The number of black portions can be the average value of the number of black portions observed in any eight regions selected from the vicinity of the interface (for example, regions within a range of 0.3 μm from the interface) between the seed layer and the copper plating layer.

EXAMPLES

The present invention is not limited to the following examples.

1. Preparation of Laminated Body for Evaluation

1-1. Laminated Body for Evaluation Including Electroless Copper Plating Layer as Seed Layer

Example 1

Formation of Insulating Resin Layer

A copper clad laminate for a printed wiring board (manufactured by Showa Denko Materials Co., Ltd.) of 50 mm square with a thickness of 0.45 mm, and an insulating material for forming an insulating resin layer (Ajinomoto Build-up Film GX-92, manufactured by Ajinomoto Fine-Techno Co., Inc.) were prepared. The insulating material included a support film, an insulating curable resin film provided on the support film, and a protective film. The protective film was peeled off from the insulating material, and the exposed curable resin film was placed on the copper clad laminate. The placed curable resin film was pressed with a press-type vacuum laminator (MVLP-500, manufactured by MEIKI CO., LTD.) to be pressure-bonded to the copper clad laminate. As a press condition, the temperature of a hot plate of the press was 80° C., a vacuuming time was 20 seconds, a press time was 60 seconds, the atmospheric pressure was 4 kPa or less, and the pressure was 0.4 MPa. After that, in an oven, the curable resin film was cured by being heated at 180° C. for 30 minutes, and then, at 190° C.

for 60 minutes to form an insulating resin layer. A laminated body consisting of the copper clad laminate and the insulating resin layer was used as a support body.

Surface Roughening of Insulating Resin Layer

The surface of the insulating resin layer of the support body was roughened by UV irradiation for 3 minutes using a UV-ozone washing apparatus (manufactured by IWASAKI ELECTRIC CO., LTD.).

Formation of Seed Layer

The support body including the insulating resin layer having the roughened surface was immersed in each of the following liquids in order to form an electroless copper plating layer as a seed layer on the roughened surface of the insulating resin layer. A liquid temperature and an immersion time are represented in parentheses.

- 50 mL/L of an aqueous solution of a reagent for a pretreatment for acidic electrolytic plating (manufactured by C.Uyemura & Co., Ltd., Product Name: MCD-PL) (40° C., for 5 minutes)
- pure water (40° C., for 1 minute)
- pure water (a room temperature, for 1 minute)
- an aqueous solution of a sulfuric acid of 10% (a room temperature, for 1 minute)
- pure water (a room temperature, for 1 minute)
- a mixed aqueous solution of a reagent for predipping (manufactured by C.Uyemura & Co., Ltd., Product Name: MDP-2) and a sulfuric acid (MDP-2 Concentration: 10 mL/L, Sulfuric Acid of 95%: 1 mL/L) (a room temperature, for 2 minutes)
- a mixed liquid of a reagent for an activator (manufactured by C.Uyemura & Co., Ltd., Product Name: MAT-SP) and NaOH (MAT-SP Concentration: 50 mL/L, NaOH: 1.6 g/L) (40° C., for 5 minutes)
- pure water (a room temperature, for 1 minute)
- a mixed liquid of a reagent for a reducer (manufactured by C.Uyemura & Co., Ltd., Product Name: MRD-2-C, MAB-4-C, MAB-4-A) (MRD-2-C Concentration: 10 mL/L, MAB-4-C Concentration: 50 mL/L, MAB-4-A Concentration: 10 mL/L) (35° C., for 3 minutes)
- pure water (a room temperature, for 1 minute)
- 50 mL/L of an aqueous solution of a reagent for an accelerator (manufactured by C.Uyemura & Co., Ltd., Product Name: MEL-3A) (a room temperature, for 1 minute)
- a mixed liquid of a reagent for electroless plating (manufactured by C.Uyemura & Co., Ltd., Product Name: PEA-6A, PEA-6-B-2X, PEA-6-C, PEA-6-D, PTA-6-E) and formaldehyde (PEA-6A Concentration: 100 mL/L, PEA-6-B-2X Concentration: 50 mL/L, PEA-6-C Concentration 14 mL/L, PEA-6-D Concentration: 15 mL/L, PEA-6-E Concentration 50 mL/L, Formaldehyde Concentration: 5 mL/L) (36° C., for 15 minutes)
- pure water (a room temperature, for 1 minute)

The laminated body in which the seed layer was formed was heated in an oven at 150° C. for 30 minutes to anneal the seed layer, and a laminated body for evaluation consisting of the support body and the seed layer was obtained. The thickness of the seed layer was 300 to 400 nm.

Example 2

A laminated body for evaluation consisting of the support body and the seed layer was prepared as with Example 1, except that the surface of the insulating resin layer was roughened by the following chemical treatment instead of the UV irradiation using the UV-ozone washing apparatus.

Chemical Treatment

The support body consisting of the insulating resin layer and the copper clad laminate was immersed in the following liquids in order. A liquid temperature and an immersion time are represented in parentheses.

- a mixed aqueous solution of 500 mL/L of a moistening solution (manufactured by Atotech, Swelling Securiganth) and 3 g/L of NaOH (80° C., for 15 minutes)
- pure water (a room temperature, for 2 minutes)
- a mixed aqueous solution of 640 mL/L of a desmear liquid (manufactured by Atotech, Ecopact CP) and 40 g/L of NaOH (80° C., for 10 minutes)
- pure water (50° C., for 2 minutes)
- a mixed aqueous solution of 100 mL/L of an acidic solution (manufactured by Atotech, Reduction Securiganth) and 50 mL/L of a sulfuric acid of 98% (40° C., for 5 minutes)
- pure water (a room temperature, for 1 minute)

Comparative Example 1

A laminated body for evaluation consisting of the support body and the seed layer was prepared as with Example 2, except that the immersion time into the mixed aqueous solution of 640 mL/L of the desmear liquid (manufactured by Atotech, Ecopact CP) and 40 g/L of NaOH was changed to 20 minutes.

Comparative Example 2

A laminated body for evaluation consisting of the support body and the seed layer was prepared as with Example 1, except that the surface of the insulating resin layer was roughened by the following plasma treatment instead of the UV irradiation using the UV-ozone washing apparatus.

Plasma Treatment

The surface of the insulating resin layer was roughened by plasma irradiation using Plasma Asher AP-1000 (manufactured by March) in the following conditions.

- RD Output: 500 W
- Base Pressure: 150 mTorr
- Process Pressure: 200 mTorr
- Pressure Range: 200 mTorr
- Oxygen Flow Rate: 100 sccm
- Irradiation Time: 10 minutes

Comparative Example 3

A laminated body for evaluation consisting of the support body and the seed layer was prepared as with Comparative Example 2, except that the irradiation time of the plasma treatment was changed to 20 minutes.

1-2. Preparation of Laminated Body for Evaluation Including Copper Foil as Seed Layer The following copper foil was prepared.

- Copper Foil A (Thickness: 5 μm, Arithmetic Mean Roughness Ra of Surface: 0.2 μm)

Copper Foil B (Thickness: 5 μm, Arithmetic Mean Roughness Ra of Surface: 0.3 μm)

Copper Foil C (Thickness: 5 μm, Arithmetic Mean Roughness Ra of Surface: 0.5 μm)

Example 3

Resin Varnish 35.8 g of o-tolidine, 469.5 g of bis(4-maleimide phenyl) methane, 35.7 g of m-aminophenol, and 360.0 g of dimethyl acetamide were put in a reaction container to react with each other at 100° C. for 2 hours, and a polyimide solution (Polyimide Concentration: 60% by mass) containing polyimide having a biphenyl skeleton was obtained.

50 parts by mass of the obtained polyimide solution, 30 parts by mass of a phenol novolac-type epoxy resin (manufactured by DIC Corporation, Product Name: EPICLON (Registered Trademark) N-770, an epoxy equivalent of 188 g/eq), 20 parts by mass of a cresol novolac resin (manufactured by DIC Corporation, Product Name: PHENOLITE (Registered Trademark) KA-1165, a hydroxyl group equivalent of 119 g/eq), 30 parts by mass of aluminum hydroxide (manufactured by Showa Denko K.K., Product Name: HP-360) and 90 parts by mass of molten silica (manufactured by ADMATECHS COMPANY LIMITED, Product Name: SC2050-KC, an average primary particle size of 0.5 μm, a BET specific surface area of 6.8 m2/g) as an inorganic filling material, 0.3 parts by mass of an imidazole derivative (a curing accelerator, manufactured by DKS Co., Ltd., Product Name: G8009L), and methyl ethyl ketone were mixed to obtain a resin varnish with a solid content concentration of 65% by mass. Here, the solid content concentration indicates the concentration of the components other than the methyl ethyl ketone that is a diluting solvent.

The resin varnish was applied to a polyethylene terephthalate film (manufactured by Teijin Dupont Film Japan Limited, Product Name: G-2) with a width of 580 mm, and the coated film was dried to form an elongated resin film with a width of 525 mm and a thickness of 7 μm.

While transporting a preheated glass woven fabric (a thickness of 15 μm, a basis weight of 13 $g/m^2$, IPC #1017, a base material width of 530 mm, manufactured by NITTO BOSEKI CO., LTD.), the glass woven fabric was interposed between two preheated resin films, and the formed laminated body was pressurized with a pressurization roll to impregnate the glass woven fabric with the resin film, and a prepreg was formed. The formed prepreg was cooled with a cooling roll, and then, wound. As the condition of the pressurization roll, a roll temperature was 100° C., a linear pressure was 0.2 MPa, and a rate was 2.0 m/minute. The pressurization roll was heated with a halogen heater (manufactured by Ushio Inc., Product Name: UH-USF-CL-700). The surface of the resin film on the glass woven fabric side was preheated with a heater disposed in a position 30 mm before the pressurization roll such that a surface temperature was 135° C. The glass woven fabric was preheated to 140° C. before the pressurization roll.

Preparation of Laminated Body for Evaluation (Copper Clad Laminate)

The obtained prepreg was cut to prepare a square prepreg of 530 mm square. The prepreg was interposed between two copper foils A with a size of 540 mm square from both surface sides, and further interposed between two SUS mirror plates of 530 mm square with a thickness of 1.8 mm. A laminated body consisting of the prepreg, the copper foil A, and the mirror plate was heated and pressurized in the condition of retaining the laminated body at a temperature increase rate of 2 to 3° C./minute in a region of 60 to 160° C., a pressure of 2.5 MPa, and the highest temperature of 220° C. for 90 minutes in a vacuum atmosphere to prepare a laminated body for evaluation (a copper clad laminate) including an insulating substrate formed of the prepreg as a support body and the copper foil as a seed layer.

Comparative Example 4

A laminated body for evaluation (a copper clad laminate) including the copper foil as a seed layer was prepared as with Example 3, except that a copper foil B was used instead of the copper foil A.

Comparative Example 5

A laminated body for evaluation (a copper clad laminate) including the copper foil as a seed layer was prepared as with Example 3, except that a copper foil C was used instead of the copper foil A.

2. Arithmetic Mean Roughness Ra of Surface of Insulating Resin Layer and Surface of Seed Layer Arithmetic mean roughness Ra of the roughened surface of the insulating resin layer and the surface of the seed layer of each of the laminated bodies for evaluation on a side opposite to the support body was measured with a laser microscope by a method defined in JIS B0601:2013 (ISO 4287:1997, Amd.1:2009.

3. Formation of Wiring Board

Formation of Resist Layer

A resist film (manufactured by Showa Denko Materials Co., Ltd., a thickness of 25 μm) including a resist layer (a thickness of 25 μm) and a protective film was laminated on the seed layer of each of the laminated bodies for evaluation such that the resist layer was in contact with the seed layer. The resist layer contains a binder polymer that is a copolymer of a methacrylic acid, methacrylic acid benzyl, and methacrylic acid alkyl ester, and a dye. The resist film was laminated with a laminator (manufactured by Lami Corporation Inc., GK-13DX) in the condition of a laminating temperature of 110° C., a laminating rate of 1.4 m/minute, and a laminating pressure of 0.5 MPa. The resist film was left to stand for 30 minutes after being laminated, and the resist layer of the resist film was exposed with light using a mask aligner (manufactured by Mikasa Co., Ltd., MIL-320FSAT), a band-pass filter (manufactured by Asahi Spectra Co., Ltd., HB0405), and a negative photomask. A light-exposure amount was 45 $mJ/cm^2$. The resist film was left to stand for 30 minutes after being exposed with light, the protective film of the resist film was peeled off, and the resist layer having a pattern including a linear opening with a width of 10 μm to which the seed layer was exposed was formed by development using an aqueous solution of sodium carbonate of 1.0% as a developer. The development was performed with an ultra-high pressure spin development device (manufactured by Blue Ocean Technology., Ltd.)

including a spray nozzle by spraying the developer for 100 seconds, and then, spraying pure water for 100 seconds. A development temperature was 30° C., a rotation frequency was 500 rpm, a spray pressure was 0.18 MPa, the movement distance of a spray nozzle head was 7.2 cm, and the movement rate of the spray nozzle head was 10 cm/s.

Pretreatment

In order for a pretreatment, the laminated body for evaluation in which the resist layer was formed was immersed in 100 mL/L of an aqueous solution of an acidic cleaner (manufactured by JCU CORPORATION, PB-242D) at 45° C. for 5 minutes, pure water at 50° C. for 1 minute, pure water at 25° C. for 1 minute, and an aqueous solution of a sulfuric acid of 10% at 25° C. for 1 minute, in this order.

Electrolytic Plating

The laminated body for evaluation after being pretreated was immersed in an electrolytic plating liquid, and a copper plating layer was formed on the seed layer at 25° C. and a current density of 10 A/$dm^2$ for 10 minutes. As the electrolytic plating liquid, a mixed liquid of 120 g/L of a copper(II) sulfate pentahydrate, 7.3 L of an aqueous solution of 220 g/L of a sulfuric acid of 96%, 0.25 mL of a hydrochloric acid, 92 mL of TOP LUCINA NSV-1 (Product Name, manufactured by OKUNO Chemical Industries Co., Ltd.), 11.5 mL of TOP LUCINA NSV-2 (Product Name, manufactured by OKUNO Chemical Industries Co., Ltd.), and 23 mL of TOP LUCINA NSV-3 (Product Name, manufactured by OKUNO Chemical Industries Co., Ltd.) was used. After the copper plating layer was formed, the laminated body was immersed in pure water at a room temperature for 1 minute, and the laminated body after being immersed was dried to obtain a wiring board including wiring including the copper plating layer provided in the linear opening of the resist layer.

3. Evaluation

Black Portion

Figure 3:
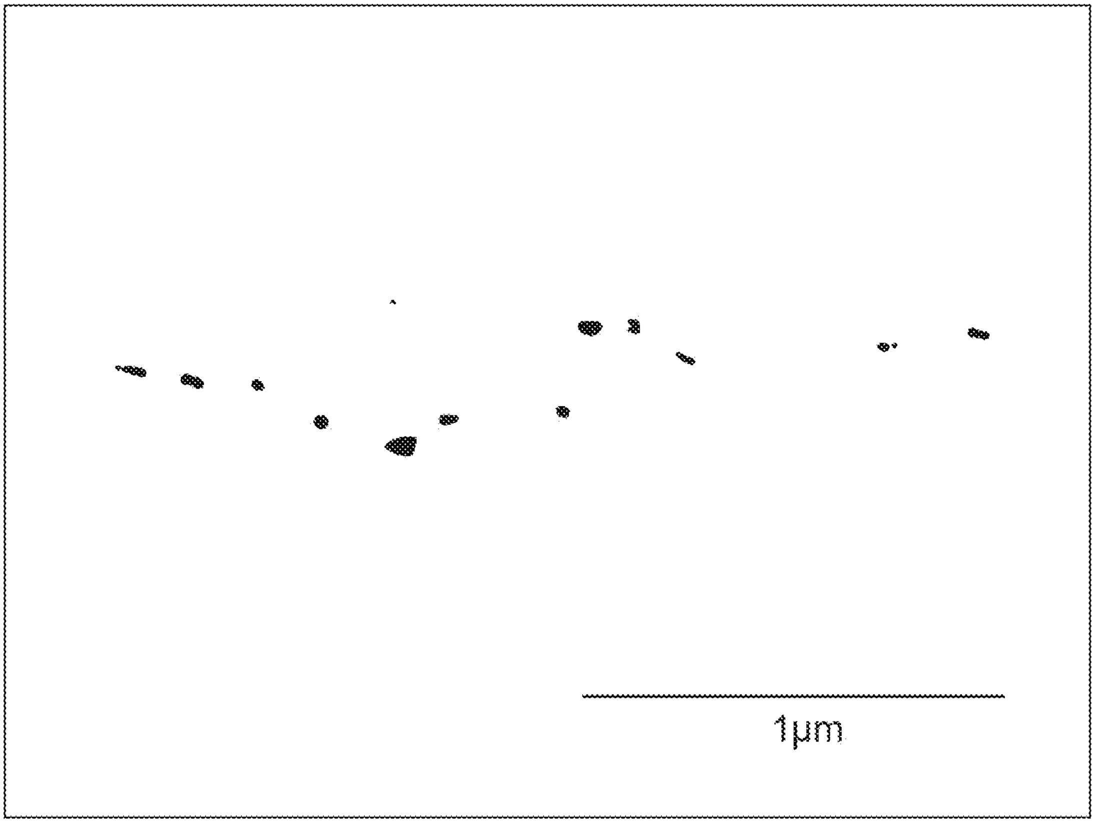
FIG. 3 is an example of an image obtained by binarizing an electron microscopic image in the vicinity of an interface between a seed layer and a copper plating layer.

The wiring board was processed with a focused ion beam device (manufactured by Hitachi High-Tech Corporation, MI4050) to prepare a test piece having a sectional surface to which the vicinity of the interface between the seed layer and the copper plating layer by the electrolytic plating was exposed. Eight spots in the vicinity of the interface between the seed layer and the copper plating layer in the test piece were captured with a scanning electron microscope (manufactured by Hitachi High-Tech Corporation, SU8200) at a magnification of 50000 times. The obtained sectional picture was binarized such that only minute black portions observed in the copper plating layer were black, and the number of black portions was recorded. FIG. 3 is an example of an image obtained by binarizing an electron microscopic image. The number of black portions per a width of 1 μm in a direction parallel to the main surface of the support body was calculated. For binarization, image editing software ImageJ was used. The average value of the number of black portions in observation positions of eight spots is shown in Table 1 and Table 2.

TABLE 1

| | Ex. 1 | Ex. 2 | Comp. Ex. 1 | Comp. Ex. 2 | Comp. Ex. 3 |
|---|---|---|---|---|---|
| Method for roughening insulating resin layer | UV-ozone (3 minutes) | Chemical treatment (10 minutes) | Chemical treatment (20 minutes) | Plasma (10 minutes) | Plasma (20 minutes) |
| Insulating resin layer (μm) | 0.14 | 0.30 | 0.32 | 0.34 | 0.36 |
| Seed layer | Electroless plating | Electroless plating | Electroless plating | Electroless plating | Electroless plating |
| Seed layer Ra (μm) | 0.14 | 0.30 | 0.32 | 0.34 | 0.36 |
| Number of black portions (pieces/μm) | 5.9 | 7.9 | 9.1 | 9.8 | 11.8 |

TABLE 2

| | Ex. 3 | Comp. Ex. 4 | Comp. Ex. 5 |
|---|---|---|---|
| Seed layer | Copper foil A | Copper foil B | Copper foil C |
| Seed layer Ra (μm) | 0.20 | 0.31 | 0.52 |
| Number of black portions (pieces/μm) | 3.1 | 18 | 29 |

As shown in Tables 1 and 2, it was confirmed that in a case where the arithmetic mean roughness Ra of the surface of the seed layer was 0.05 μm or more and 0.30 μm or less, the occurrence of the black portion in the vicinity of the interface between the seed layer and the electrolytic copper plating layer was effectively suppressed.

REFERENCE SIGNS LIST

1: support body, 2: wiring, 3: resist layer, 20: seed layer, 20S: surface of seed layer on side opposite to support body, 21: copper plating layer, 10: wiring board.

The invention claimed is:

1. A method for manufacturing a wiring board, comprising:

forming a resist layer on a seed layer comprising a metal provided on a support body;

forming a pattern including an opening to which the seed layer is exposed in the resist layer by light exposure and development of the resist layer; and forming a copper plating layer on the seed layer exposed into the opening by electrolytic plating, in this order, wherein arithmetic mean roughness Ra of a surface of the seed layer on a side opposite to the support body is adjusted in a range of 0.05 um or more and 0.30 um or less such that a number of black portions with a width of less than 0.3 um observed in the copper plating layer in a vicinity of an interface between the seed layer and the copper plating layer is 9.0 or less per a width of 1 μm in a direction parallel to a main surface of the support body.

2. The method according to claim 1, further comprising providing the seed layer on the support body by electroless plating.

3. The method according to claim 2, further comprising roughening a surface of the support body, wherein the seed layer is provided on the roughened surface of the support body.

4. The method according to claim 3, wherein the surface of the support body is roughened such that surface roughness Ra of the surface of the support body is 0.05 um or more and 0.30 um or less.

5. The method according to claim 1, further comprising providing the seed layer by laminating a metal foil on the support body.

6. The method according to claim 1, wherein a thickness of the seed layer is 200 nm or more and 1000 nm or less.

7. The method according to claim 1, wherein the resist layer before the light exposure comprises a binder polymer comprising a (meth) acrylic acid as a monomer unit.

8. The method according to claim 7, wherein the binder polymer further comprises at least one of (meth) acrylic acid benzyl ester or a derivative thereof, or styrene or a styrene derivative, as a monomer unit.

9. The method according to claim 1, wherein the resist layer before the light exposure comprises a dye.

10. A wiring board comprising:

a support body; and wiring including a seed layer comprising a metal provided on the support body, and a copper plating layer formed by electrolytic plating, wherein arithmetic mean roughness Ra of a surface of the seed layer on a side opposite to the support body is 0.05 um or more and 0.30 um or less, and wherein a number of black portions with a width of less than 0.3 um observed in the copper plating layer in a vicinity of an interface between the seed layer and the copper plating layer is 9.0 or less per a width of 1 μm in a direction parallel to a main surface of the support body.

* * * * *